United States Patent
Lee et al.

(10) Patent No.: US 9,006,044 B2
(45) Date of Patent: Apr. 14, 2015

(54) GRAPHENE DEVICE AND METHOD OF MANUFACTURING THE SAME

(75) Inventors: Chang-seung Lee, Yongin-si (KR);
Joo-ho Lee, Hwaseong-si (KR);
Yong-sung Kim, Namyangju-si (KR);
Chang-youl Moon, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 33 days.

(21) Appl. No.: 13/546,615

(22) Filed: Jul. 11, 2012

(65) Prior Publication Data

US 2013/0193411 A1    Aug. 1, 2013

(30) Foreign Application Priority Data

Jan. 26, 2012 (KR) .................. 10-2012-0007797

(51) Int. Cl.
| | | |
|---|---|---|
| *H01L 21/00* | (2006.01) | |
| *H01L 21/84* | (2006.01) | |
| *H01L 29/06* | (2006.01) | |
| *H01L 21/683* | (2006.01) | |
| *H01L 29/16* | (2006.01) | |
| *H01L 29/778* | (2006.01) | |
| *H01L 29/417* | (2006.01) | |

(52) U.S. Cl.
CPC .......... *H01L 29/778* (2013.01); *H01L 21/6835* (2013.01); *H01L 29/1606* (2013.01); *H01L 29/41775* (2013.01); *H01L 2221/68327* (2013.01); *H01L 2221/6835* (2013.01); *H01L 2221/68368* (2013.01); *Y10S 977/734* (2013.01)

(58) Field of Classification Search
CPC .............................................. H01L 2221/6835
See application file for complete search history.

(56) References Cited

U.S. PATENT DOCUMENTS

| | | | |
|---|---|---|---|
| 7,858,989 B2 | 12/2010 | Chen et al. | |
| 2010/0301336 A1 | 12/2010 | Babich et al. | |
| 2010/0320445 A1 | 12/2010 | Ogihara et al. | |
| 2011/0057168 A1* | 3/2011 | Kobayashi | 257/24 |
| 2011/0070146 A1* | 3/2011 | Song et al. | 423/448 |
| 2011/0114918 A1 | 5/2011 | Lin et al. | |
| 2011/0284818 A1* | 11/2011 | Avouris et al. | 257/9 |
| 2012/0028414 A1* | 2/2012 | Yonehara et al. | 438/109 |
| 2012/0181510 A1* | 7/2012 | Avouris et al. | 257/29 |
| 2013/0098540 A1 | 4/2013 | Lee et al. | |

FOREIGN PATENT DOCUMENTS

JP    2008205272 A    9/2008

OTHER PUBLICATIONS

Levendorf, et al., "Transfer-Free Batch Fabrication of Single Layer Graphene Transistors", Nano Letters, (2009), vol. 9, No. 12, pp. 4479-4483.

* cited by examiner

*Primary Examiner* — William F Kraig
*Assistant Examiner* — Khaja Ahmad
(74) *Attorney, Agent, or Firm* — Harness, Dickey & Pierce, P.L.C.

(57) ABSTRACT

A method of manufacturing a graphene device may include forming a device portion including a graphene layer on the first substrate; attaching a second substrate on the device portion of the first substrate; and removing the first substrate. The removing of the first substrate may include etching a sacrificial layer between the first substrate and the graphene layer. After removing the first substrate, a third substrate may be attached on the device portion. After attaching the third substrate, the second substrate may be removed.

26 Claims, 22 Drawing Sheets

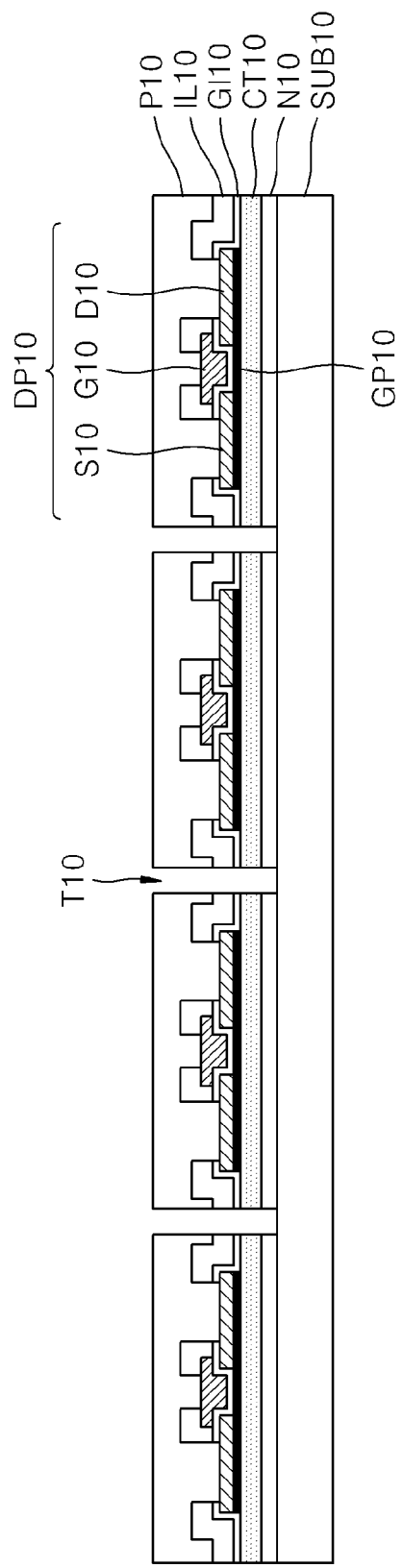

GRAPHENE DEVICE AND METHOD OF MANUFACTURING THE SAME

CROSS-REFERENCE TO RELATED APPLICATION

This application claims priority under 35 U.S.C. §119 to Korean Patent Application No. 10-2012-0007797, filed on Jan. 26, 2012 in the Korean Intellectual Property Office, the disclosure of which is incorporated herein in its entirety by reference.

BACKGROUND

1. Field

The present disclosure relates to graphene devices and methods of manufacturing the same.

2. Description of the Related Art

The degree of integration and the capacity of silicon (Si)-based semiconductor devices have been greatly improved. However, due to the characteristics of Si materials and limitations in manufacturing processes, it is expected to be more difficult to implement higher integration and higher capacity Si-based semiconductor devices in the future.

Thus, research into next generation devices that overcome limitations in Si-based semiconductor devices are being carried out. For example, attempts have been made to manufacture a high-performance device by using a carbon-based nanostructure, such as graphene. Graphene is a single-layer hexagonal structure consisting of carbon atoms, is stable chemically and structurally, and exhibits desirable electrical/physical properties. For example, graphene has a charge mobility of up to about $2\times10^5$ cm$^3$/Vs, which is more than one hundred times faster than that of silicon, and has a current density of about $10^8$ A/cm$^3$, which is more than one hundred times greater than that of copper (Cu). Thus, graphene has drawn attention as a next-generation material that overcomes limitations in general devices.

However, it is relatively difficult to manufacture a device by using graphene since there are some limitations in a forming process of graphene. With existing technologies, it is relatively difficult to grow high-quality graphene on an insulating thin film. Thus, graphene has to be formed on a metal thin film and then transferred onto another substrate. However, the graphene may have some defects or be exposed to pollutants during the transfer of the graphene. Also, it is not easy to handle the graphene. Accordingly, manufacturing a device to which graphene is applied is limited.

SUMMARY

Various embodiments relate to high-performance graphene devices and methods of manufacturing the same.

Various embodiments also relate to methods of manufacturing graphene devices in which damage or pollution to graphene is prevented or minimized.

A method of manufacturing a graphene device may include forming a graphene layer on a first substrate; forming a device portion on the first substrate, the device portion including the graphene layer; attaching a second substrate onto the device portion; and removing the first substrate.

The forming of the device portion may include forming a source electrode and a drain electrode respectively contacting a first region and a second region of the graphene layer.

The forming of the device portion may include forming a gate insulating layer covering the graphene layer, the source electrode, and the drain electrode; and forming a gate on the gate insulating layer and between the source electrode and the drain electrode.

The method may further include forming an insulating layer covering the device portion and disposed between the device portion and the second substrate; and etching portions of the insulating layer and the gate insulating layer to expose the source electrode, the drain electrode, and the gate.

The method may further include attaching a third substrate on the device portion after the removing the first substrate, wherein the device portion is disposed between the second substrate and the third substrate.

The method may further include removing the second substrate.

The third substrate may be one of a glass substrate, a plastic substrate, and a polymer substrate.

The third substrate may be a flexible substrate.

The method may further include forming a protection layer between the device portion and the third substrate.

The method may further include forming an insulating layer covering the device portion after the removing the first substrate, wherein the device portion is disposed between the insulating layer and the second substrate.

The source electrode, the drain electrode, and the gate may be formed to respectively include a first pad portion, a second pad portion, and a third pad portion, wherein the insulating layer is formed to cover the first through third pad portions. The method may further include etching portions of the insulating layer to expose the first through third pad portions.

The method may further include, after the removing the first substrate, forming a gate insulating layer covering the graphene layer, the source electrode, and the drain electrode; and forming a gate on the gate insulating layer and between the source electrode and the drain electrode.

The source electrode and the drain electrode may be formed to respectively include a first pad portion and a second pad portion, and the method may further include etching portions of the gate insulating layer to expose the first and second pad portions.

The method may further include forming a catalyst layer between the first substrate and the graphene layer.

The method may further include forming an intermediate layer between the first substrate and the catalyst layer.

The removing the first substrate may include etching the catalyst layer.

The removing the first substrate may include etching one of the catalyst layer and the intermediate layer.

The method may further include, before the attaching the second substrate, forming a protection layer covering the device portion on the first substrate.

The second substrate may be a polymer substrate.

The method may include forming a device layer including a plurality of the device portions on the first substrate; and separating the plurality of the device portions by patterning the device layer.

A sacrificial layer may be further disposed between the first substrate and the device layer.

The removing the first substrate may include etching the sacrificial layer by injecting an etching solution between the plurality of the device portions.

The sacrificial layer may be a metal layer or an insulating layer.

A graphene transistor may include a first insulating layer on a substrate, the first insulating layer having a concave portion; a graphene device portion formed on the concave portion of the first insulating layer; and a second insulating layer formed to cover the graphene device portion, wherein the graphene device portion may include a gate; a gate insulating layer covering the gate; a source electrode and a drain electrode on the gate insulating layer at both sides of the gate; and a graphene layer contacting the source electrode and the drain electrode.

The gate insulating layer may be extended onto the first insulating layer around the graphene layer.

A portion of the gate insulating layer extended onto the first insulating layer may have the same height as the graphene layer.

The gate may overlap with the source electrode and the drain electrode.

The substrate may be a polymer substrate.

According to another non-limiting embodiment, a graphene transistor may include a protection layer formed on a substrate; a source electrode and a drain electrode formed in the protection layer; a graphene layer that is formed to connect the source electrode and the drain electrode and is disposed at the same height as an upper surface of the protection layer; a gate insulating layer formed on the protection layer to cover the graphene layer; and a gate formed on the gate insulating layer.

An upper surface of the graphene layer and an upper surface of the protection layer around the graphene layer may be at the same height.

The source electrode may be disposed below a first region of the graphene layer, and the drain electrode may be disposed below a second region of the graphene layer.

The substrate may be a polymer substrate.

BRIEF DESCRIPTION OF THE DRAWINGS

The above and/or other aspects of example embodiments will become more apparent and more readily appreciated from the following description, taken in conjunction with the accompanying drawings in which:

FIGS. 8A through 8E are cross-sectional views illustrating another method of manufacturing a graphene device, according to a non-limiting embodiment.

DETAILED DESCRIPTION

Figure 1A:
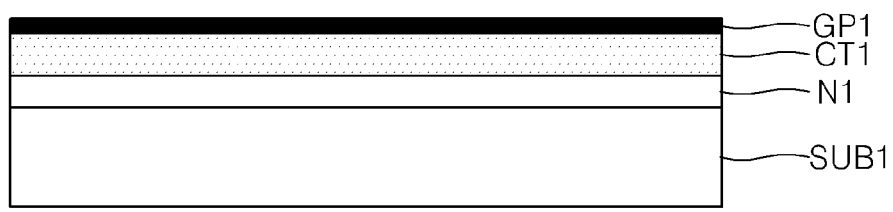
FIGS. 1A through 1L are cross-sectional views illustrating a method of manufacturing a graphene device, according to a non-limiting embodiment.

Reference will now be made in further detail to various example embodiments, which may be illustrated in the accompanying drawings, wherein like reference numerals refer to like elements throughout. In this regard, the example embodiments may have different forms and should not be construed as being limited to the descriptions set forth herein. Accordingly, various example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, graphene devices and methods of manufacturing the same, according to example embodiments, will be described in more detail with reference to the accompanying drawings. In the drawings, the width and thickness of layers and regions may have been exaggerated for clarity. The same reference numerals represent the same elements throughout the drawings.

FIGS. 1A through 1L are cross-sectional views illustrating a method of manufacturing a graphene device, according to a non-limiting embodiment.

Referring to FIG. 1A, a catalyst layer CT1 may be formed on a first substrate SUB1. As the first substrate SUB1, for example, a silicon substrate may be used. Before forming the catalyst layer CT1, a desired or predetermined intermediate layer N1 may be formed first on the first substrate SUB1, and then the catalyst layer CT1 may be formed on the intermediate layer N1. The intermediate layer N1 may prevent or reduce a reaction between the substrate SUB1 and the catalyst layer CT1, for example, a silicide reaction. Also, the intermediate layer N1 may prevent or reduce material diffusion between the first substrate SUB1 and the catalyst layer CT1. The intermediate layer N1 may be formed as an insulating layer, for example, a silicon oxide layer. When the first substrate SUB1 is a silicon substrate, a surface portion (upper surface portion) of the first substrate SUB1 may be oxidized to form a silicon oxide layer which is to be used as the intermediate layer N1. A thickness of the intermediate layer N1 may be about 100 nm to about 300 nm. The material and method of forming the intermediate layer N1 are not limited as described above and may vary. For example, the intermediate layer N1 may be formed as a nitride layer and may also be formed using other methods than an oxidizing method. According to circumstances, the intermediate layer N1 may not be formed.

The catalyst layer CT1 may be formed of at least one metal selected from the group consisting of Ni, Cu, Co, Pt, and Ru, or a combination thereof. The catalyst layer CT1 may have a single-layer or a multiple layer structure. The catalyst layer CT1 may be formed by using various methods such as plating, evaporation, sputtering, chemical vapor deposition (CVD), or atomic layer deposition (ALD). The catalyst layer CT1 may be formed to have a thickness of about 100 nm to about 500 nm.

Next, a graphene layer GP1 may be formed on the catalyst layer CT1. The graphene layer GP1 may be formed by using a CVD method or a pyrolysis method. When forming the graphene layer GP1 by using a CVD method, a source gas containing carbon may be supplied onto the catalyst layer CT1. As the source gas, $CH_4$, $C_2H_2$, $C_2H_4$, CO or the like may be used, for example. To form the graphene layer GP1, a relatively high temperature process performed at about 700° C. to 1100° C. may be used. Accordingly, the first substrate SUB1 may be formed of a material that is resistant to the high temperature process. In this respect, the first substrate SUB1 may be a silicon substrate. However, any other substrate than a silicon substrate that is resistant to a high temperature process may be used as the first substrate SUB1. For example, a quartz substrate may be used as the first substrate SUB1. According to circumstances, a SiC substrate may be used as the first substrate SUB1. When using the SiC substrate as the first substrate SUB1, the graphene layer GP1 may be directly formed on the SiC substrate without the catalyst layer CT1 therebetween.

Figure 1B:
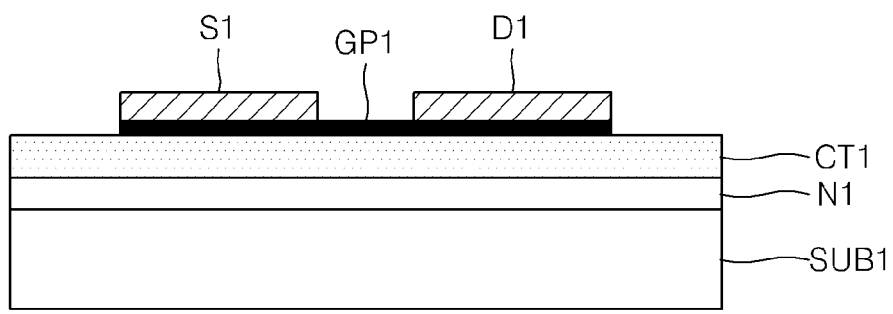

Referring to FIG. 1B, after patterning the graphene layer GP1 into a predetermined, desired, or given shape, a source electrode S1 and a drain electrode D1 that respectively contact a first region and a second region of the graphene layer GP1 may be formed. The source electrode S1 and the drain electrode D1 may be formed at a first end and a second end of the graphene layer GP1, respectively. A portion of the graphene layer GP1 between the source electrode S1 and the drain electrode D1 may be referred to as a "channel region." The graphene layer GP1, the source electrode S1, and the drain electrode D1 as illustrated in FIG. 1B may be formed using various methods. For example, the graphene layer GP1 of FIG. 1A may be patterned in a first mask operation, and then a conductive layer, which is formed on the graphene layer GP1, may be patterned in a second mask operation to form the source electrode S1 and the drain electrode D1. Alternatively, a conductive layer for forming a source/drain may be formed on the graphene layer GP1 of FIG. 1A, and then the graphene layer GP1 and the conductive layer may be patterned together using a mask (first patterning). Next, the conductive layer may be patterned using another mask (second patterning). By the first patterning operation, the graphene layer GP1 as illustrated in FIG. 1B may be obtained, and the source electrode S1 and the drain electrode D1 may be obtained by the first and second patterning operations. Alternatively, after patterning the graphene layer GP1 in the form as illustrated in FIG. 1B, the source electrode S1 and the drain electrode D1 may be formed on the graphene layer GP1 by using a lift-off method.

Hereinafter, one of various non-limiting methods for forming the structure of FIG. 1B will be described with reference to FIGS. 2A through 2D.

Figure 2A:
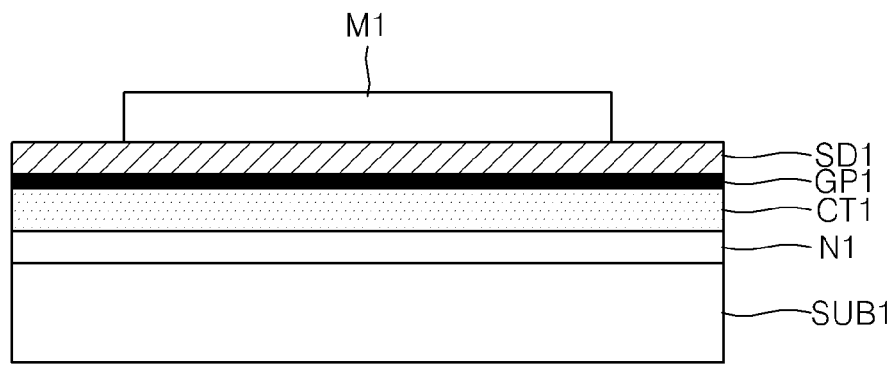
FIGS. 2A through 2D are cross-sectional views illustrating a method of forming a structure illustrated in FIG. 1B according to a non-limiting embodiment.

Referring to FIG. 2A, a conductive layer SD1 for forming a source electrode and a drain electrode may be formed on the graphene layer GP1 of FIG. 1A, and a first mask pattern M1 may be formed on the conductive layer SD1.

Figure 2B:
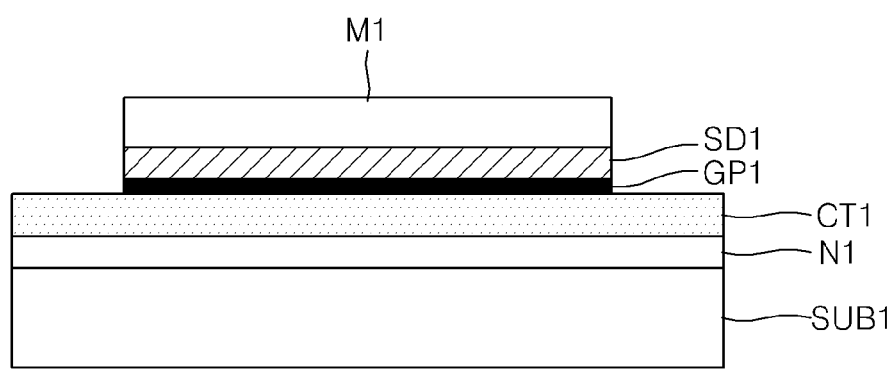

Referring to FIG. 2B, the conductive layer SD1 and the graphene layer GP1 may be sequentially etched by using the first mask pattern M1 as an etching barrier. Accordingly, the conductive layer SD1 and the graphene layer GP1 may be patterned in the same shape when seen from above.

Figure 2C:
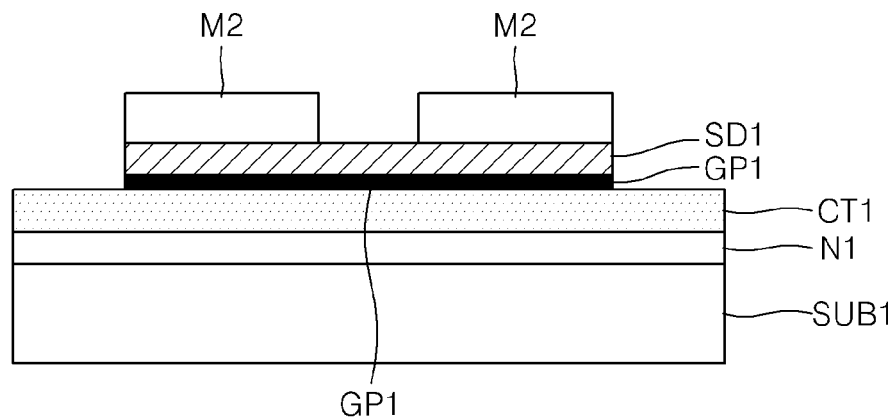

Referring to FIG. 2C, after removing the first mask pattern M1, a second mask pattern M2 may be formed on the conductive layer SD1. The second mask pattern M2 may be an etching mask for forming a source electrode and a drain electrode.

Figure 2D:
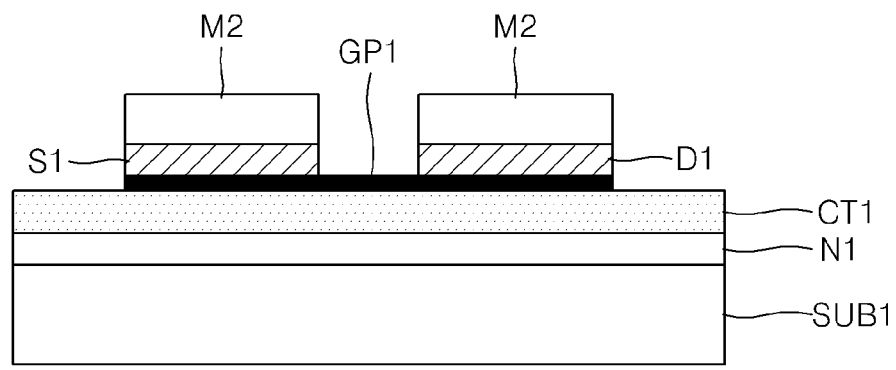

Referring to FIG. 2D, by using the second mask pattern M2 as an etching barrier, the conductive layer SD1 may be etched. As a result, a source electrode S1 and a drain electrode D1 may be formed. Then, by removing the second mask pattern M2, the structure as illustrated in FIG. 1B may be obtained.

A conductive layer for forming the source electrode S1 and the drain electrode D1, that is, a conductive layer SD1 may be formed using, for example, an evaporation method. Since the graphene layer GP1 may be damaged by plasma, the conductive layer SD1 may be formed by using a method that does not use plasma. An example of the method is an evaporation method. However, the method for forming the conductive layer SD1 for forming a source/drain is not limited to the evaporation method and may vary. In addition, when patterning (etching) the conductive layer SD1, a method that does not use plasma, for example, a wet etching method, may be used. Alternatively, a lift-off method may be used to directly form a source electrode S1 and a drain electrode D1 that are separated from each other.

Referring to FIG. 1B again, the source electrode S1 and the drain electrode D1 may be formed of a material that may make an ohmic contact with the graphene layer GP1. For example, the source electrode S1 and the drain electrode D1 may be formed of a material (metal) selected from the group consisting of Au, Cu, Ni, Ti, Pt, Ru, and Pd or a combination thereof. In detail, the source electrode S1 and the drain electrode D1 may be formed of Ti/Au or Pd/Au, for example. According to circumstances, an ohmic contact layer (not shown) may be further formed between the graphene layer GP1 and each of the source electrode S1 and the drain electrode D1. In this case, even a material that is not in an ohmic contact with the graphene layer GP1 may be used to form the source electrode S1 and the drain electrode D1.

Figure 1C:
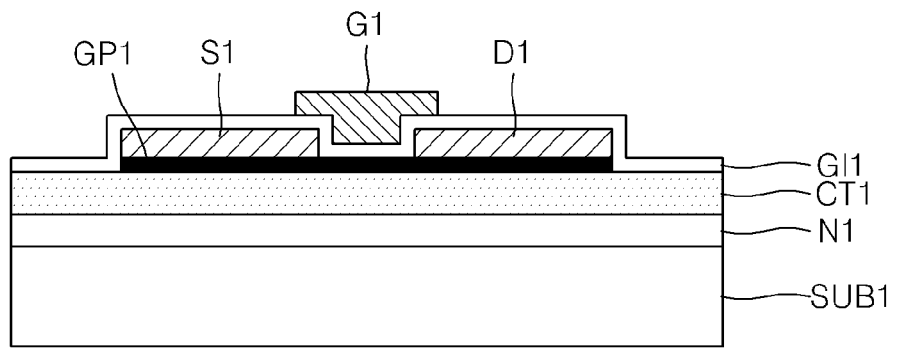

Referring to FIG. 1C, a gate insulating layer GI1 that covers the graphene layer GP1 and the source electrode S1 and the drain electrode D1 may be formed on the catalyst layer CT1. The gate insulating layer GI1 may be formed of Si oxide, Si nitride, Si oxynitride, or a high-k material having a higher dielectric constant than Si nitride, such as Al oxide, Hf oxide, or the like, or an organic material such as polymer. Alternatively, a mixture of at least two of the above-described materials may be used to form the gate insulating layer GI1. The gate insulating layer GI1 may be formed using a method such as a thermal ALD method, a thermal CVD method, or an evaporation method. When forming the gate insulating layer GI1, a process temperature may be about 400° C. or less. However, according to circumstances, the process temperature may be higher than 400° C. A thickness of the gate insulating layer GI1 may be about 10 nm to about 30 nm, for example.

Next, a gate G1 may be formed on the gate insulating layer GI1 between the source electrode S1 and the drain electrode D1. The gate G1 may extend over the source electrode S1 and the drain electrode D1 to some extent. That is, the gate G1 may have a structure overlapping with the source electrode S1 and the drain electrode D1 in some degree. However, depending on the circumstances, the gate G1 may not overlap with the source electrode S1 and the drain electrode D1. In addition, even though the gate G1 of FIG. 1C is higher than the gate insulating layer GI1, a height of the gate G1 may also be substantially the same as or similar to a height of the gate insulating layer GI1. The height of the gate insulating layer GI1 refers to the height of the gate insulating layer GI1 formed on the source electrode S1 and the drain electrode D1. The gate G1 may be formed of a conductive material (e.g., metal, a conductive oxide, etc.) that is used in a typical semiconductor device. If the gate G1 is formed as described above, a position of the gate G1 with respect to the source electrode S1 and the drain electrode D1 may be self-aligned. Since the gate G1 fills up the space between the source electrode S1 and the drain electrode D1, the position of the gate G1 with respect to the source electrode S1 and the drain electrode D1 may be self-aligned. In addition, when the gate G1 is overlapped with the source electrode S1 and the drain electrode D1, even when the gate G1 is slightly misaligned, a position of an effective gate region is not changed but may be maintained constant. The effective gate region refers to a region of the gate G1 between the source electrode S1 and the drain electrode D1. As described above, since the position of the gate G1 with respect to the source electrode S1 and the drain electrode D1 is self-aligned, misalignment may be prevented (or reduced), and resistance between the source electrode S1 and the drain electrode D1 may be minimized.

Figure 1D:
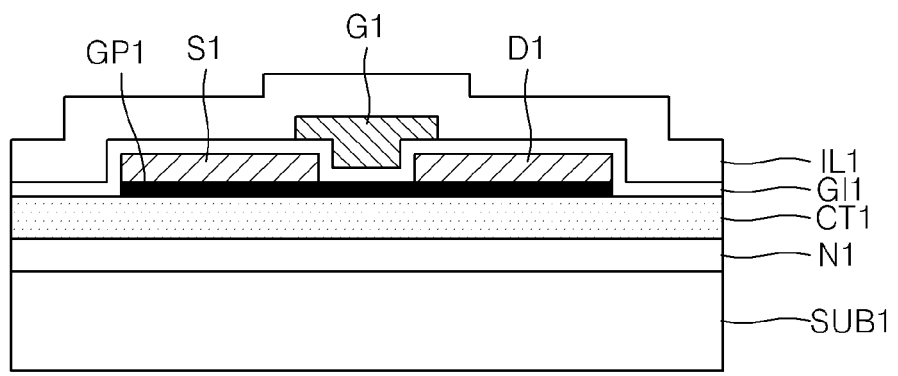

Referring to FIG. 1D, an insulating layer IL1 covering the gate insulating layer GI1 and the gate G1 may be formed on the first substrate SUB1. The insulating layer IL1 may be formed of, for example, Si oxide, Si nitride, or Si oxynitride. A thickness of the insulating layer IL1 may be, for example, about 100 nm to about 500 nm.

Figure 1E:
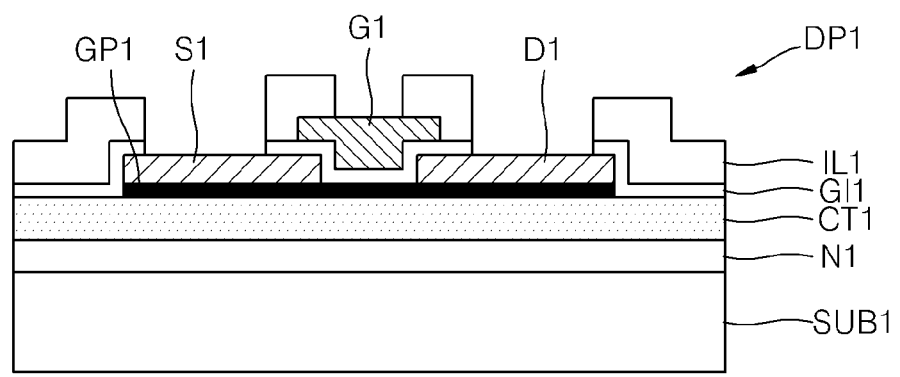

Referring to FIG. 1E, portions of the insulating layer IL1 and the gate insulating layer GI1 may be etched to expose portions of the gate G1, the source electrode S1, and the drain electrode D1, respectively. However, it should be understood that an opening operation of exposing the portions of the gate G1, the source electrode S1, and the drain electrode D1 may performed at a different time (stage). For example, the opening operation may be performed in the last stage of the method of manufacturing the graphene device, according to a non-limiting embodiment.

By using the method described above with reference to FIGS. 1A through 1E, a device portion DP1 including the graphene layer GP1 may be formed on the first substrate SUB1. The device portion DP1 may be a "graphene transistor."

Figure 1F:
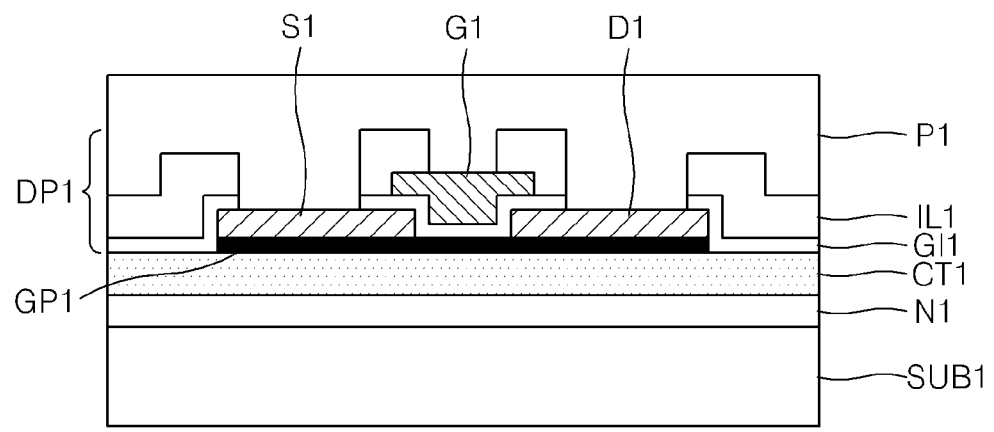

Referring to FIG. 1F, a first protection layer P1 covering the device portion DP1 may be formed on the first substrate SUB1. The first protection layer P1 may be formed of a polymer material or a spin on glass (SOG) material, and by using, for example, a spin coating method. The first protection layer P1 may be formed to have a planar surface. If the surface of the first protection layer P1 is not planar, a planarization process for planarizing the surface may be additionally performed. The first protection layer P1 may be used to facilitate attachment of a second substrate SUB2 (see FIG. 1G) in a subsequent operation. In addition, the first protection layer P1 may protect the device portion DP1 when removing the first substrate SUB1 in a subsequent operation.

Figure 1G:
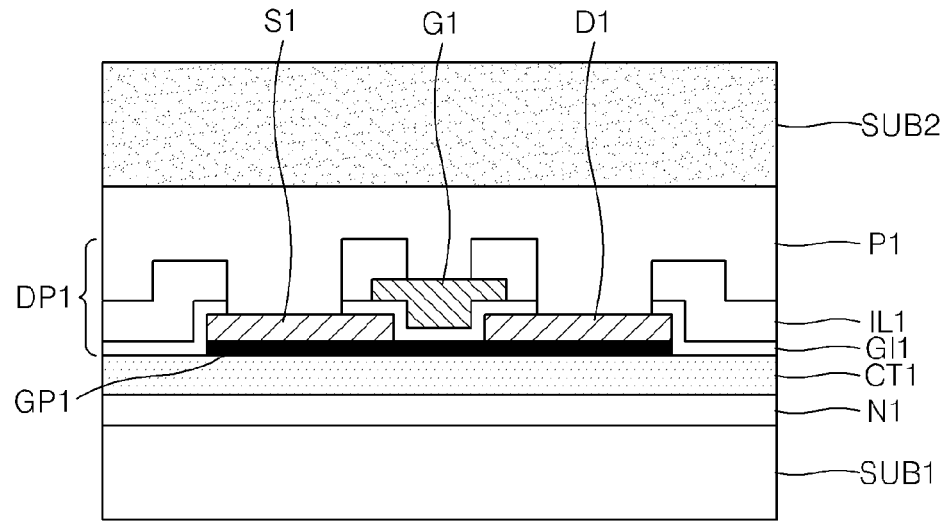

Referring to FIG. 1G, the second substrate SUB2 may be attached on the first protection layer P1. The second substrate SUB2 may be regarded as attached on the first substrate SUB1 with the device portion DP1 and the first protection layer P1 interposed therebetween. For example, the second substrate SUB2 may be a substrate including a polymer. In detail, the second substrate SUB2 may be an adhesive tape. The adhesive tape may be an ultraviolet (UV) release type adhesive tape which loses its adhesive force in response to UV rays, or a thermal release type adhesive tape which loses its adhesive force in response to heat. Alternatively, the second substrate SUB2 may be formed of a polymer which is removable by using a predetermined or desired solvent. However, the material for forming the second substrate SUB2 is not limited to a polymer such as an adhesive tape, and may vary. According to circumstances, the second substrate SUB2 may be formed of glass or silicon (Si). In this case, a predetermined or desired adhesive layer (not shown) may be further included between the first protection layer P1 and the second substrate SUB2. The second substrate SUB2 may prevent or reduce wrinkling and folding of the device portion DP1 when separating the first substrate SUB1 later or in another subsequent operation. According to circumstances, the first protection layer P1 may perform the function of the second substrate SUB2. In this case, the first protection layer P1 may be regarded as a substrate, and thus, the second substrate SUB2 may not be included.

Figure 1H:
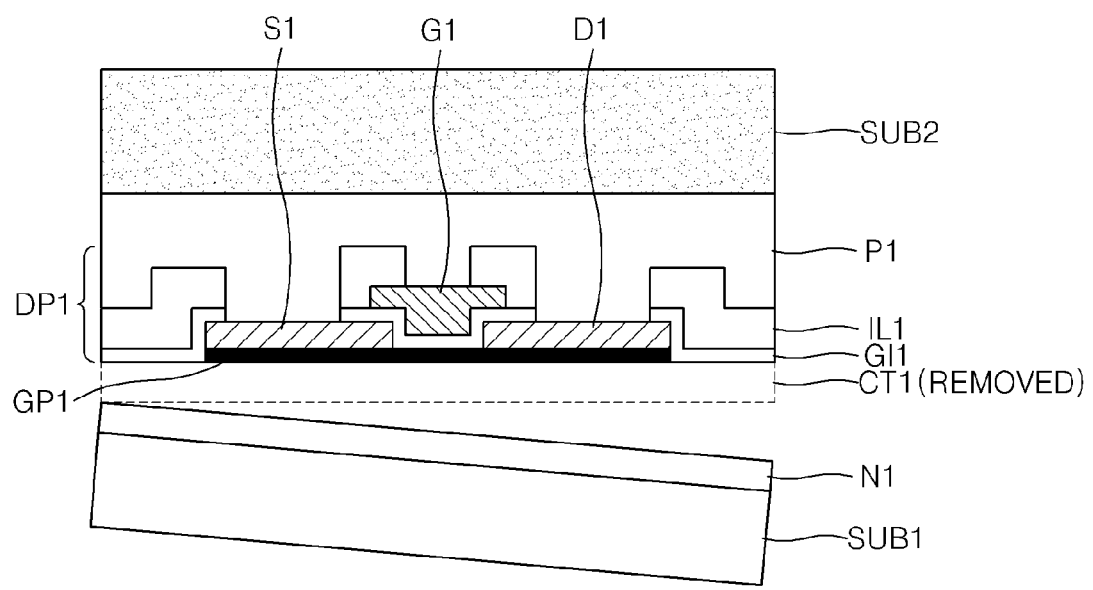

Referring to FIG. 1H, the first substrate SUB1 may be removed/separated. The first substrate SUB1 may be removed/separated by etching the catalyst layer CT1 and/or the intermediate layer N1. According to a non-limiting embodiment, the first substrate SUB1 is removed/separated by etching the catalyst layer CT1. When etching the catalyst layer CT1, an etchant for etching metal such as $FeCl_3$ or $HNO_3$ may be used. If the first substrate SUB1 is removed by etching the intermediate layer N1 instead of the catalyst layer CT1, in order to etch the intermediate layer N1, for example, an etching solution containing HF may be used. The method of removing/separating the first substrate SUB1 is not limited to the description above, and may vary. For example, most of the first substrate SUB1 may be removed using a polishing process, and a remaining portion of the first substrate SUB1 may be removed using a predetermined or desired etching solution, and then the intermediate layer N1 and the catalyst layer CT1 may be sequentially removed. As an etching solution for removing the remaining first substrate SUB1, KOH or tetramethylammonium hydroxide (TMAH) may be used, for example.

Figure 1I:
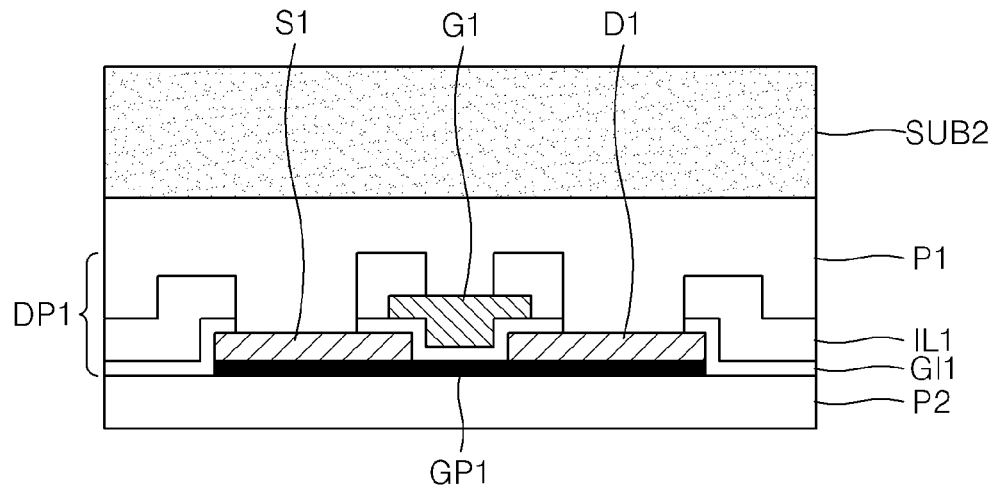

Referring to FIG. 1I, a second protection layer P2 may be formed on a lower surface of the device portion DP1 that is exposed by removing the first substrate SUB1. The second protection layer P2 may protect the graphene layer GP1 so that properties/characteristics of the graphene layer GP1 do not vary. For example, the second protection layer P2 may be formed of Si oxide, Si nitride, or Si oxynitride, or a high-k material such as Al oxide or Hf oxide, or polymer. The second protection layer P2 may be formed using a method that does not damage the graphene layer GP1, such as a thermal ALD method, a thermal CVD method, or an evaporation method. While the second protection layer P2 is illustrated as being formed on a lower surface of the device portion DP1 in FIG. 1I, in actuality, the second protection layer P2 may be formed after overturning the structure including the second substrate SUB2 and the device portion DP1, that is, turning over the graphene layer GP1 of the device portion DP1 to face upwards.

Figure 1J:
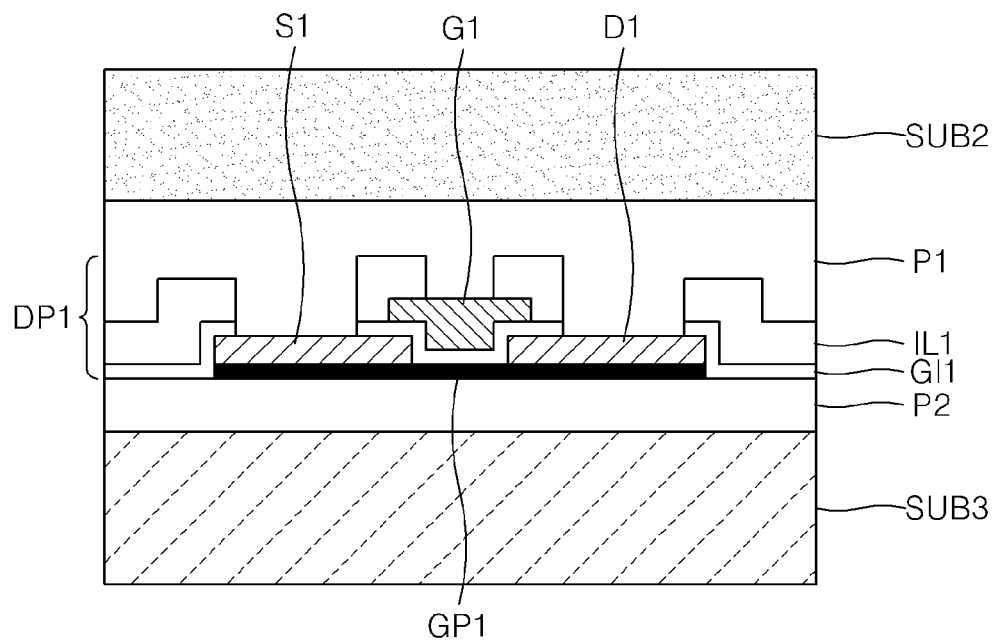

Referring to FIG. 1J, a third substrate SUB3 may be attached on the second protection layer P2. The third substrate SUB3 may be regarded as attached to the device portion DP1 with the second protection layer P2 interposed therebetween. The third substrate SUB3 may be, for example, a glass substrate, a plastic substrate, or a polymer substrate. The third substrate SUB3 may be a flexible substrate or also a rigid substrate. When selecting a material of the third substrate SUB3, there is no limitation such as a process temperature, and thus, various substrates may be used as the third substrate SUB3.

Figure 1K:
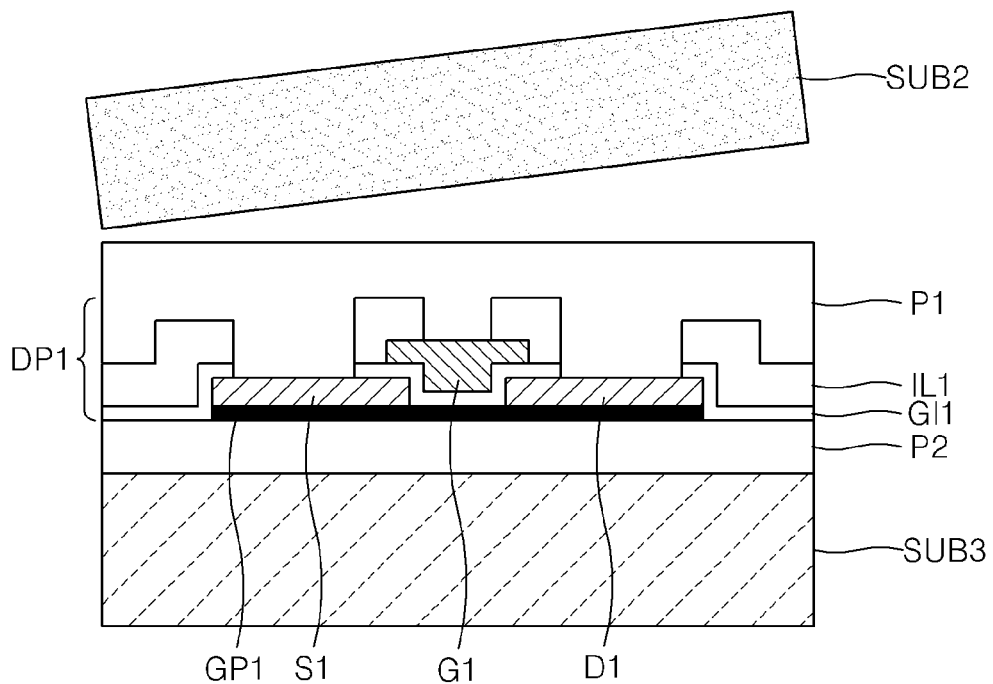

Referring to FIG. 1K, the second substrate SUB2 may be removed. For example, when the second substrate SUB2 is a thermal release type adhesive tape, the second substrate SUB2 may be easily removed by applying heat at about 200° C. The removing method may vary according to the type of the second substrate SUB2.

Figure 1L:
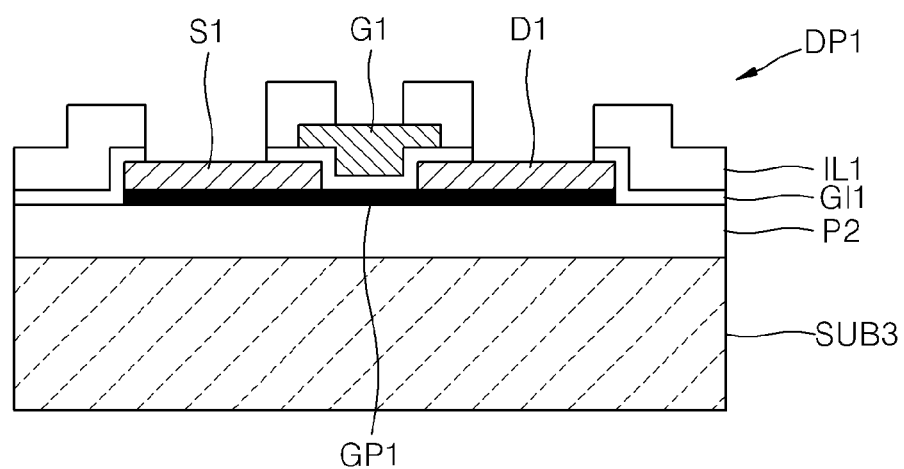

Next, the first protection layer P1 may be removed. The first protection layer P1 may be removed using an oxygen plasma process or a wet etching process. If the first protection layer P1 is a polymer, the first protection layer P1 may be removed using an oxygen plasma process, and if the first protection layer P1 is dielectric layer, the first protection layer P1 may be removed using a wet etching process. A resultant structure after removing the first protection layer P1 is illustrated in FIG. 1L. Referring to FIG. 1L, the device portion DP1, including the graphene layer GP1, may be formed on the third substrate SUB3.

As described above, according to a non-limiting embodiment, after manufacturing the device portion DP1, including the graphene layer GP1 on the first substrate SUB1, the device portion DP1 may be attached on another substrate, that is, on the third substrate SUB3. In this process, the second substrate SUB2 that supports the device portion DP1 may be temporarily used for handleability, and the first substrate SUB1 may be removed. In other words, the process according to a non-limiting embodiment may include a graphene growing and device fabrication operation on the first substrate SUB1, and attaching the fabricated device on another substrate (i.e., the third substrate SUB3). In this process, damage or pollution to the graphene layer GP1 may be prevented or minimized, and thus, a graphene device having a higher quality may be manufactured. According to the related art, a graphene is grown on a first substrate and then transferred to another substrate, and a device manufacturing operation is performed on this other substrate. In this case, as the graphene is transferred alone without being patterned, the graphene may tear or wrinkle, and be exposed to a pollutant so that the quality of the graphene may easily deteriorate. However, according to a non-limiting embodiment, after forming the device portion DP1 including the graphene GP1 on the first substrate SUB1, the whole device portion DP1 may be attached on the other substrate (i.e., the third substrate SUB3). Accordingly, damage or pollution to the graphene layer GP1 may be minimized, and as a result, a graphene device having a higher quality may be manufactured.

Also, as the position of the gate G1 with respect to the source electrode S1 and the drain electrode D1 is self-aligned, resistance between the source electrode S1 and the drain electrode D1 may be minimized, and operating characteristics of the graphene device may be improved.

In addition, as various substrates may be applied as the third substrate SUB3 that is used as a final substrate, usability of the graphene device may be increased, and the application field thereof may be broadened. For example, when a flexible substrate is used as the third substrate SUB3, the graphene device according to a non-limiting embodiment may be used in a flexible display device; and when a transparent substrate such as a glass substrate is used as the third substrate SUB3, the graphene device may be applied to a transparent display device. In addition, the graphene device according to a non-limiting embodiment may be applied to radio frequency (RF) devices for high-frequency applications instead of display devices.

FIGS. 3A through 3D are cross-sectional views illustrating another method of manufacturing a graphene device, according to a non-limiting embodiment.

Figure 3A:
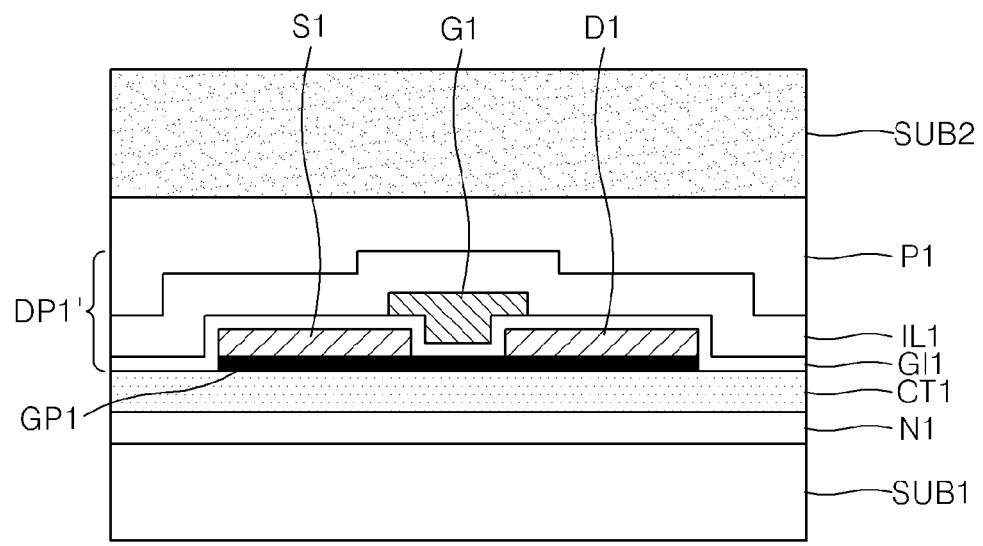
FIGS. 3A through 3D are cross-sectional views illustrating another method of manufacturing a graphene device, according to a non-limiting embodiment.

Referring to FIG. 3A, similar to the method described with reference to FIGS. 1A through 1G, a structure in which a device portion DP1' is formed on a first substrate SUB1 and a second substrate SUB2 is attached on the device portion DP1' may be prepared. The device portion DP1' may include a graphene layer GP1, a source electrode S1, a drain electrode D1, a gate insulating layer GI1, and a gate G1. Also, an insulating layer IL1 covering these layers may be further included. In the structure of FIG. 3A, unlike the structure of FIG. 1G, the insulating layer IL1 and the gate insulating layer GI1 may not be patterned (etched). A first protection layer P1 may be formed on the insulating layer IL1, and the second substrate SUB2 may be attached on the first protection layer P1.

Figure 3B:
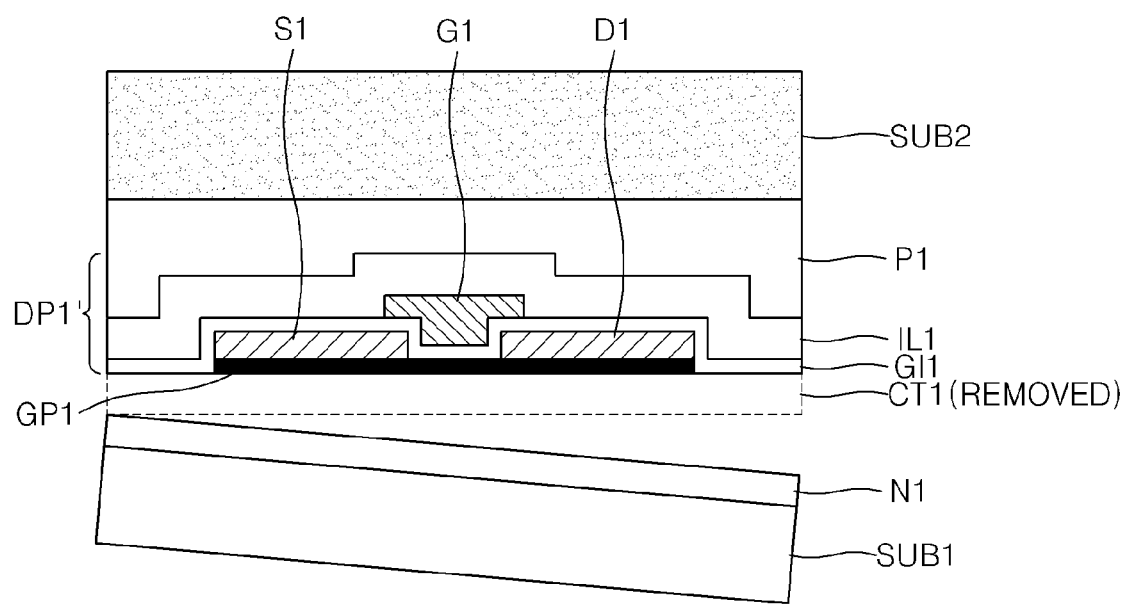

Referring to FIG. 3B, similar to the operation of FIG. 1H, the first substrate SUB1 may be removed/separated. While the first substrate SUB1 is removed/separated by etching the catalyst layer CT1 in a non-limiting embodiment, the intermediate layer N1 may be etched instead to remove/separate the first substrate SUB1. When removing or separating the first substrate SUB1 by etching the intermediate layer N1, a process for removing the catalyst layer CT1 may be additionally performed.

Figure 3C:
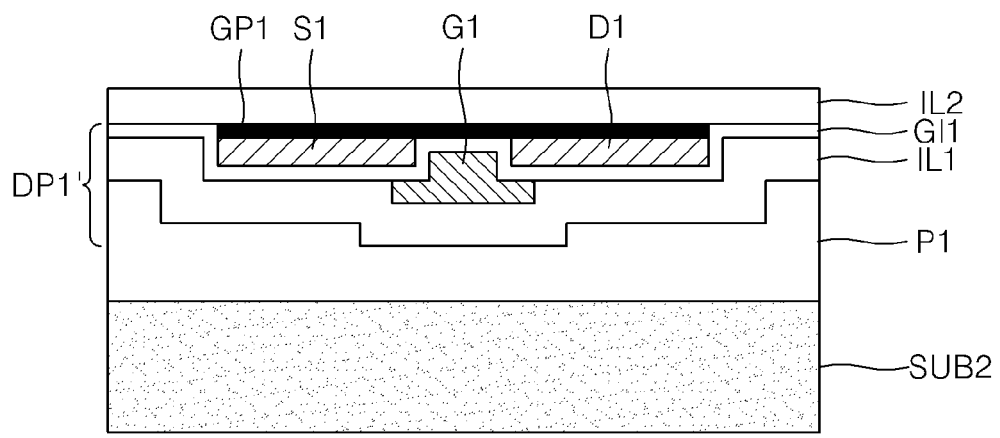

Referring to FIG. 3C, the second substrate SUB2 on which the device portion DP1' is formed may be overturned, and a second insulating layer IL2 may be formed on the device portion DP1'. The second insulating layer IL2 may be formed of a material which is the same as or similar to the insulating layer IL1 (hereinafter, first insulating layer IL1). The second insulating layer IL2 may be formed using a method that does not damage the graphene layer GP1, such as a thermal ALD method, a thermal CVD method, or an evaporation method.

Figure 4A:
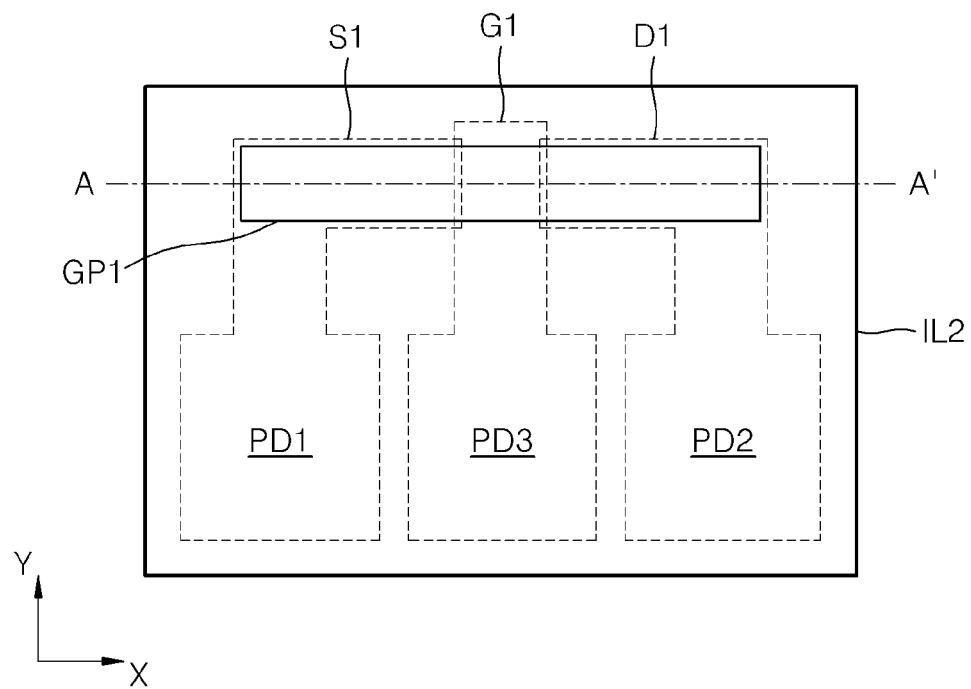
FIG. 4A is a plan view illustrating a planar structure of the graphene device of FIG. 3C according to a non-limiting embodiment.

The device portion DP1' of FIG. 3C may have a planar structure, for example, as illustrated in FIG. 4A. Referring to FIG. 4A, the graphene layer GP1 may extend in an X-axis direction. The source electrode S1 may contact a first end of the graphene layer GP1 and may include a first pad portion PD1 that extends outside of the graphene layer GP1. Similarly, the drain electrode D1 may contact a second end of the graphene layer GP1 and may include a second pad portion PD2 that extends outside of the graphene layer GP1. The gate G1 may overlap with a center portion of the graphene layer GP1 and may include a third pad portion PD3 that extends in a Y-axis direction. The second insulating layer IL2 may be formed to cover the graphene layer GP1, the source electrode S1, the drain electrode D1, and the gate G1. The cross-sectional view cut along a line A-A' of FIG. 4A may be like FIG. 3C. Accordingly, although not illustrated in FIG. 3C, the source electrode S1, the drain electrode D1, and the gate G1 may include the first pad portion PD1, the second pad portion PD2, and the third pad portion PD3, respectively.

Figure 3D:
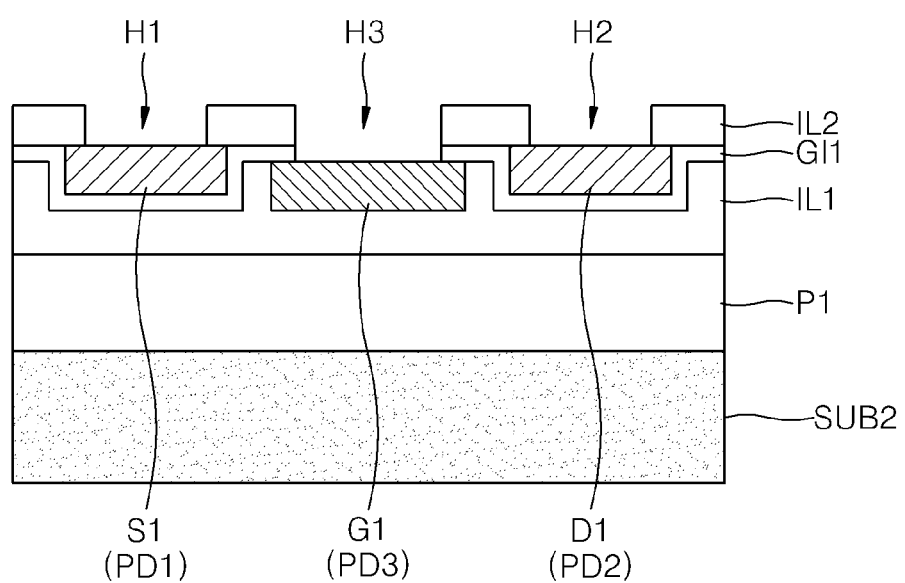

Next, a structure as illustrated in FIG. 3D may be formed. The structure illustrated in FIG. 3D may correspond to an operation regarding the first through third pad portions PD1 through PD3 of FIG. 4A. In detail, first through third contact holes H1 through H3 exposing the first through third pad portions PD1 through PD3 may be formed by etching portions of the second insulating layer IL2 and the gate insulating layer GI1. The cross-sectional view of FIG. 3D may correspond to a planar structure of FIG. 4B. The cross-sectional view cut along a line B-B' of FIG. 4B may be the view of FIG. 3D.

Figure 4B:
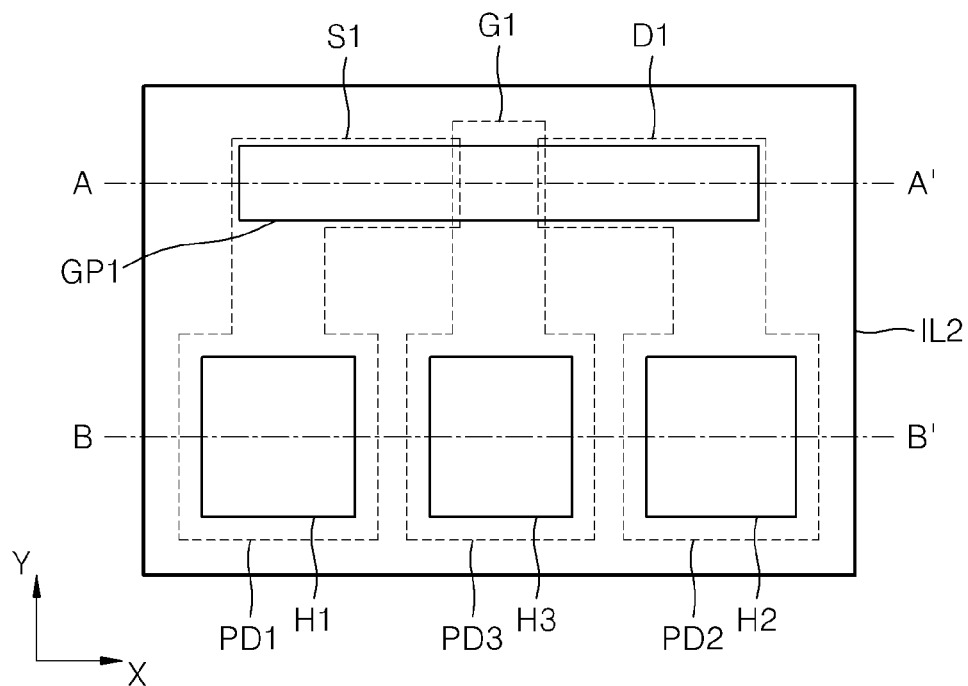
FIG. 4B is a plan view illustrating a planar structure of FIG. 3D according to a non-limiting embodiment.
Figure 5:
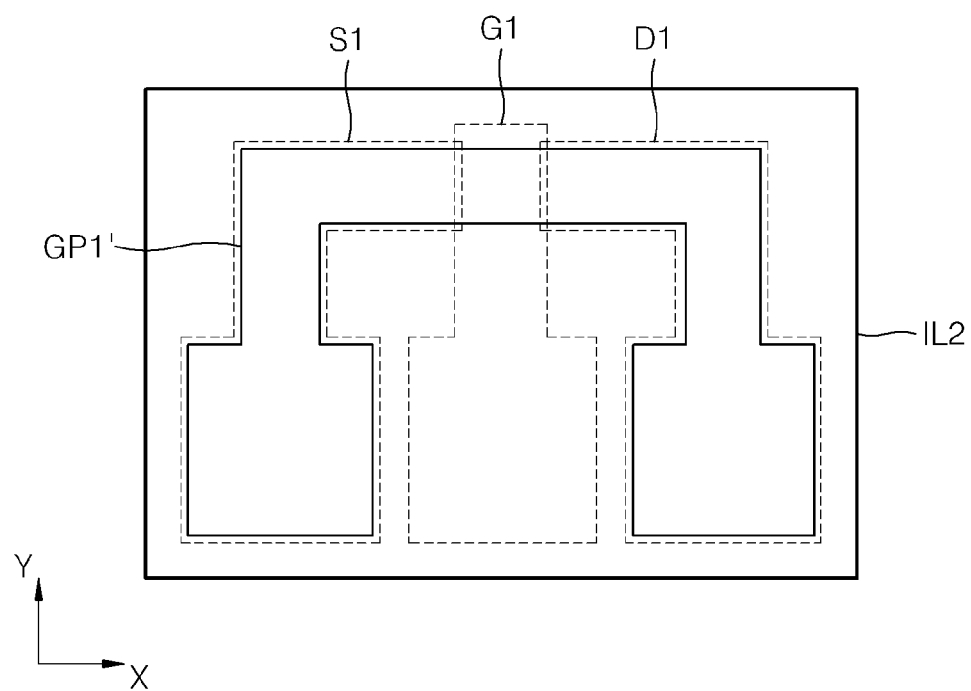
FIG. 5 is a plan view illustrating a modified example of FIG. 4A.

In FIGS. 4A and 4B, the shapes of the graphene layer GP1, the source electrode S1, the drain electrode D1, and the gate G1 are merely examples, and may vary. For example, the graphene layer GP1 may be modified to a structure illustrated in FIG. 5. Referring to FIG. 5, a graphene layer GP1' may have the same or similar planar structure as the source electrode S1 and the drain electrode D1 but include a center portion corresponding to a portion between the source electrode S1 and the drain electrode D1. In other words, the graphene layer GP'1 may include a first region having a planar structure that is the same or similar to the source electrode S1, a second region having a planar structure that is the same or similar to the drain electrode D1, and a third region (center portion) that connects the first and second regions. As described above with reference to FIGS. 2A through 2D, by sequentially patterning the graphene layer GP1 and the conductive layer SD1 for source/drain by using the first mask pattern M1 (see FIG. 2B), they may have the same planar structure, and by patterning the conductive layer SD1 for forming a source/drain by using the second mask pattern M2 (see FIG. 2C) in a subsequent operation, the source electrode S1 and the drain electrode D1 may be formed and a channel region (the third region) between the source and drain electrodes S1 and D2 may be exposed.

According to the embodiment described with reference to FIGS. 3A through 3D, the second substrate SUB2 may be used as a substrate of a final device, and the operation of attaching the third substrate SUB3 of FIG. 1J and the operation of removing of the second substrate SUB2 of FIG. 1K may be omitted. As the number of manufacturing processes is reduced, the whole manufacturing method may be simplified. Also, according to the method described with reference to FIGS. 3A through 3D, while the first substrate SUB1 and the second substrate SUB2 are formed on two sides of the device portion DP1' (i.e., below and above), the first substrate SUB1 is removed, and the second substrate SUB2 is used as a final substrate. Thus, a direct transfer operation of the graphene layer GP1 may not be included. Accordingly, the method according to a non-limiting embodiment may be referred to as a method in which a graphene device is manufactured without transferring graphene, that is, a transfer-free process.

The cross-sectional view cut along a line A-A' of FIG. 4B may be the same as FIG. 3C, and thus, the structure of FIG. 3C may be regarded as a cross-sectional view of a transistor according to a non-limiting embodiment.

The transistor according to a non-limiting embodiment will be described with reference to FIG. 3C. A first protection layer P1 may be disposed on a second substrate SUB2, and a first insulating layer IL1 may be disposed on the first protection layer P1. The second substrate SUB2 may be, for example, a polymer substrate. The first protection layer P1 may be formed of an insulating material, and accordingly, the first protection layer P1 and the first insulating layer IL1 may be regarded as forming a multi-layer insulating layer. The first insulating layer IL1 may have a concave portion in a surface thereof, and a "graphene device portion" may be formed in the concave portion. The graphene device portion may include a gate G1, a gate insulating layer GI1 formed on the gate G1, a source electrode S1 and a drain electrode D1 formed on the gate insulating layer GI1 at two sides of the gate G1, and a graphene layer GP1 formed to contact the source electrode S1 and the drain electrode D1. The graphene layer GP1 may be a channel layer. The gate insulating layer GI1 may extend onto the first insulating layer IL1 around the graphene layer GP1. A portion of the gate insulating layer GI1 extended onto the first insulating layer IL1 may be disposed at the same (or similar) height as the graphene layer GP1. The gate G1 may overlap with the source electrode S1 and the drain electrode D1. A second insulating layer IL2 covering the graphene layer GP1 and the gate insulating layer GI1 may be further provided.

FIGS. 6A through 6D are cross-sectional views illustrating another method of manufacturing a graphene device, according to a non-limiting embodiment.

Figure 6A:
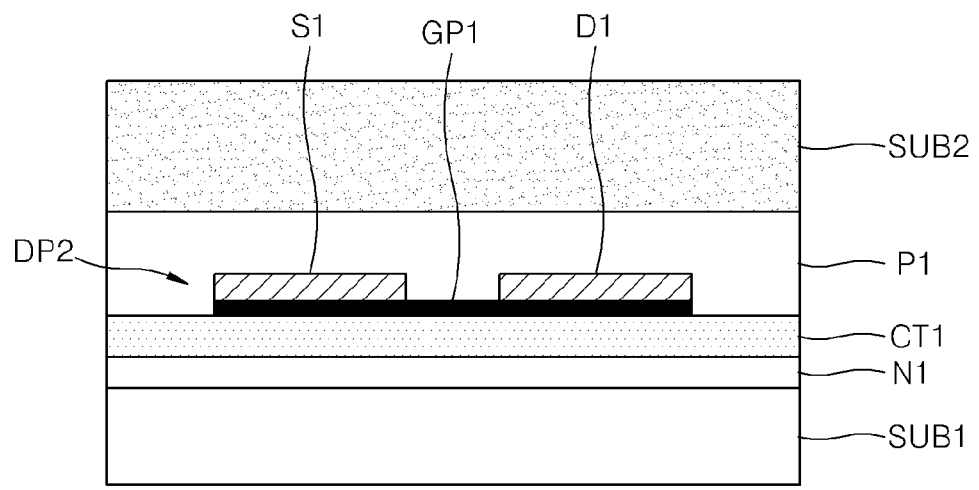
FIGS. 6A through 6D are cross-sectional views illustrating another method of manufacturing a graphene device, according to a non-limiting embodiment.

Referring to FIG. 6A, after the structure of FIG. 1B is prepared, a protection layer P1 covering a source electrode S1, a drain electrode D1, and a graphene layer GP1 may be formed on a first substrate SUB1. The protection layer P1 may be formed using the same (or similar) material and method as the first protection layer P1 illustrated in FIG. 1F. Next, a second substrate SUB2 may be attached on the protection layer P1. The second substrate SUB2 may be formed using the same (or similar) material and method as the second substrate SUB2 illustrated in FIG. 1G. According to circumstances, a predetermined or desired adhesive layer (not shown) may be further disposed between the protection layer P1 and the second substrate SUB2. The graphene layer GP1, the source electrode S1, and the drain electrode D1 may constitute a device portion DP2. Differently from the device portion DP1 illustrated in FIG. 1E, the device portion DP2 may be not completely formed.

Figure 6B:
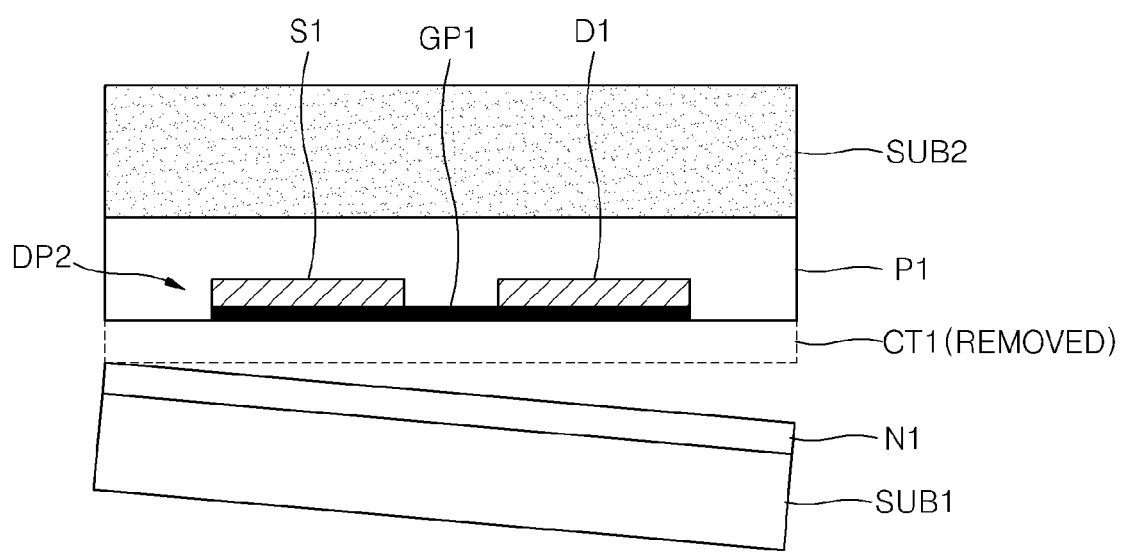

Referring to FIG. 6B, the first substrate SUB1 may be removed/separated. The first substrate SUB1 may be removed/separated by etching the catalyst layer CT1 or the intermediate layer N1. According to the current embodiment, the catalyst layer CT1 is etched to remove/separate the first substrate SUB1. The method of removing/separating the first substrate SUB1 may be substantially the same as (or similar to) the method described with reference to FIG. 1H, or may vary.

Figure 6C:
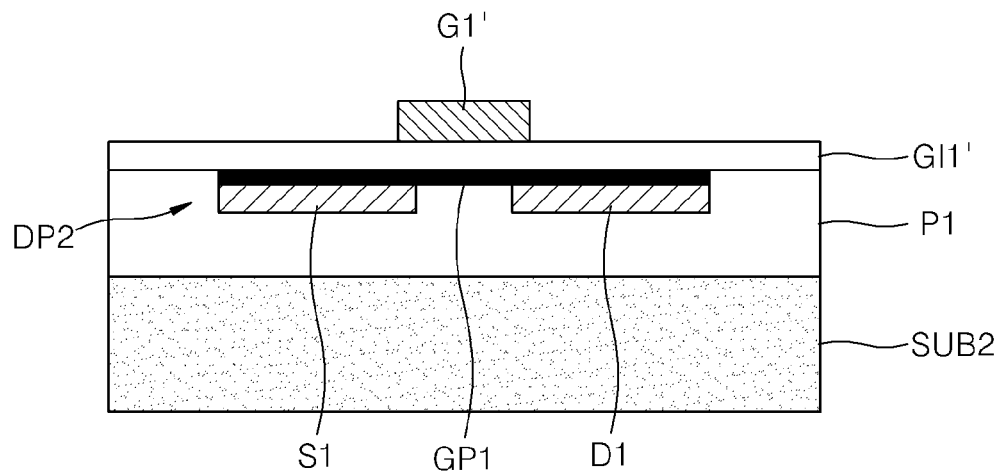

Referring to FIG. 6C, the second substrate SUB2 on which the graphene layer GP1, the source electrode S1, and the drain electrode D1 are formed may be overturned, and a gate insulating layer GI1' may be formed on the graphene layer GP1 and the protection layer P1. The gate insulating layer GI1' may be formed using the same (or similar) material and method as the gate insulating layer GI1 of FIG. 1C. A gate G1' may be formed on the gate insulating layer GI1'. The gate G1' may be disposed above the graphene layer GP1 between the source electrode S1 and the drain electrode D1.

Figure 7A:
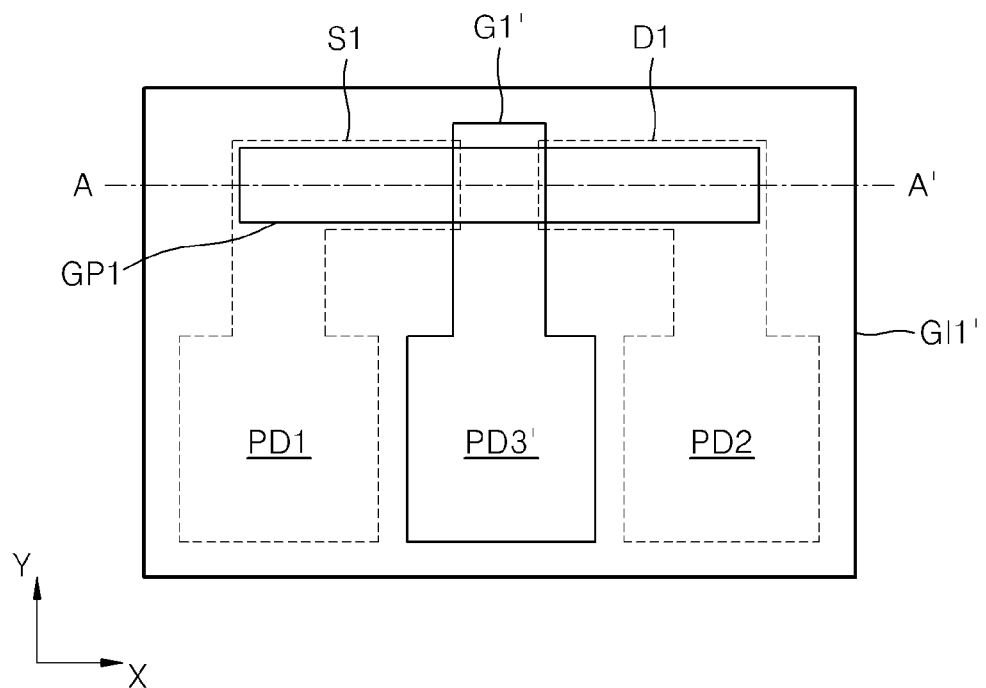
FIG. 7A is a plan view illustrating a planar structure of FIG. 6C.

A transistor illustrated in FIG. 6C may have a planar structure as illustrated in FIG. 7A. The planar structure of FIG. 7A is similar to that of FIG. 4A. However, the gate G1' is disposed on the graphene layer GP1 and the gate insulating layer G1'. In FIG. 7A, reference numerals PD1, PD2, and PD3' denote a first pad portion, a second pad portion, and a third pad portion, respectively. A cross-sectional view cut along a line A-A' of FIG. 7A may be the view of FIG. 6C.

Figure 6D:
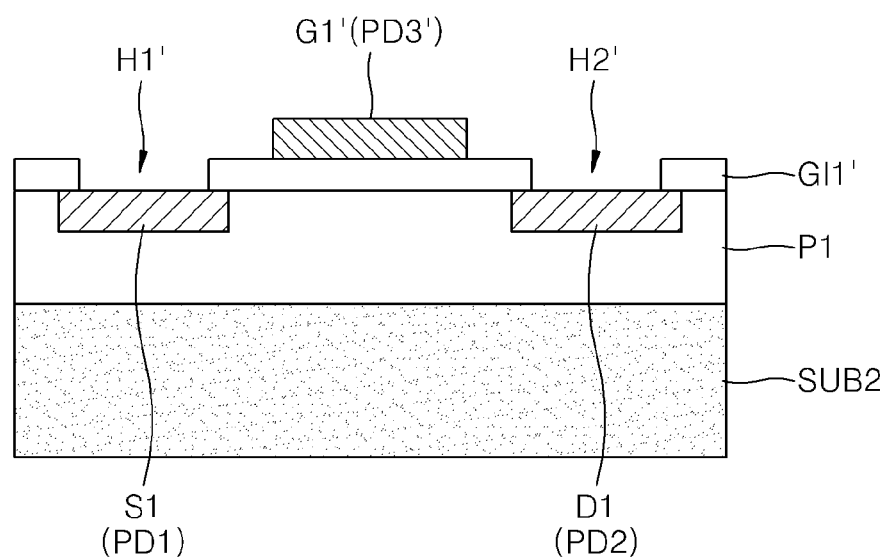
Figure 7B:
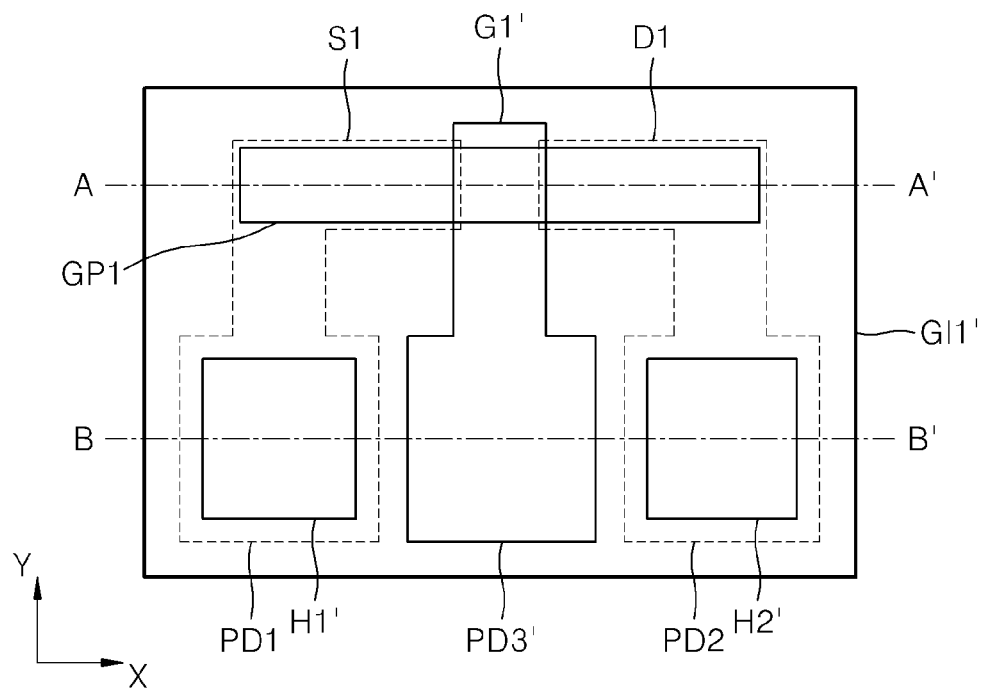
FIG. 7B is a plan view illustrating a planar structure of FIG. 6D.

Next, a structure as illustrated in FIG. 6D may be formed. FIG. 6C may correspond to an operation with respect to the first and second pad portions PD1 and PD2 of FIG. 7A. In detail, first and second contact holes H1' and H2' that respectively expose the first and second pad portions PD1 and PD2 may be formed by etching portions of the gate insulating layer GI1'. The cross-sectional view of FIG. 6D may correspond to the planar structure of FIG. 7B. A cross-sectional view cut along a line B-B' of FIG. 7B may be as illustrated in FIG. 6D. The graphene layer GP1, the source electrode S1, the drain electrode D1, and the gate G1' of FIGS. 7A and 7B are merely examples, and may also vary. For example, the graphene layer GP1 may have the same or similar form as the graphene layer GP1' of FIG. 5.

In the embodiment described with reference to FIGS. 6A through 6D, the second substrate SUB2 is used as a final substrate, and the operation of attaching the third substrate SUB3 of FIG. 1J and the operation of removing the second substrate SUB2 of FIG. 1K may be omitted. Thus, the manufacturing method may be simplified. In addition, in the method described with reference to FIGS. 6A through 6D, while the first substrate SUB1 and the second substrate SUB2 are formed on two sides of the device portion DP2 (i.e., below and above, the first substrate SUB1 is removed, and the second substrate SUB2 is used as a final substrate, and thus, a direct transfer operation of the graphene layer GP1 is not included. Accordingly, damage or pollution to a graphene layer that occurs when the graphene layer is directly transferred may be prevented or minimized.

A cross-sectional view cut along a line A-A' of FIG. 7B may be the view of FIG. 6C, and thus, FIG. 6C may be regarded as a cross-sectional view of a transistor according to a non-limiting embodiment.

A transistor according to a non-limiting embodiment will be described with reference to FIG. 6C. A protection layer P1 may be disposed on a second substrate SUB2. The second substrate SUB2 may be, for example, a polymer substrate. A source electrode 51 and a drain electrode D1 that are separated from each other may be included in the protection layer P1. A graphene layer GP1 that connects the source electrode 51 and the drain electrode D1 may be formed. The source electrode 51 and the drain electrode D1 may be disposed below a first region and a second region of the graphene layer GP1, respectively. The graphene layer GP1 may be disposed at the same height as an upper surface of the protection layer P1. In other words, an upper surface of the graphene layer GP1 and the upper surface of the protection layer P1 around the graphene layer GP1 may have the same level (height). A gate insulating layer GI1' covering the graphene layer GP1 may be disposed on the protection layer P1. A gate G1' may be disposed on the gate insulating layer GI1'. The gate G1' may be disposed above the graphene layer GP1 between the source electrode 51 and the drain electrode D1.

According to another non-limiting embodiment, a plurality of the device portions DP1 may be formed on the first substrate SUB1, and then the plurality of the device portions DP1 may be separated using a patterning operation. Then, the first substrate SUB1 may be removed. This will be described in detail with reference to FIGS. 8A through 8E.

Figure 8A:
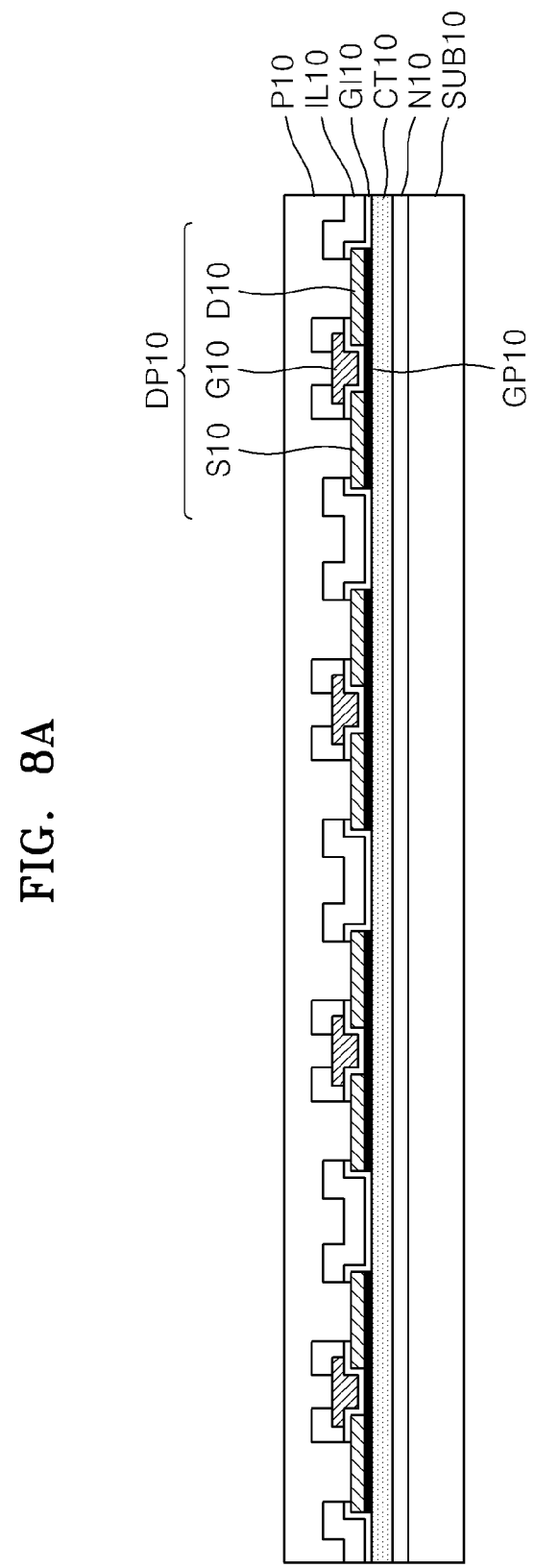

Referring to FIG. 8A, a stack structure (device layer) including a plurality of device portions DP10 may be formed on a first substrate SUB10. The plurality of device portions DP10 may each have the same structure as the device portion DP1 of FIG. 1F. The stack structure (device layer) including the plurality of device portions DP10 may have a continuous structure. A catalyst layer CT10 may be disposed between the first substrate SUB10 and the plurality of device portions DP10. An intermediate layer N10 may be further disposed between the first substrate SUB10 and the catalyst layer CT10. Reference numerals GP10, S10, D10, GI10, G10, IL10, and P10 respectively denote a graphene layer, a source electrode, a drain electrode, a gate insulating layer, a gate, an insulating layer, and a protection layer.

Referring to FIG. 8B, the stack structure formed on the first substrate SUB10, that is, the device layer including the plurality of device portions DP10, may be patterned to separate the plurality of device portions DP10. The patterning operation may be performed until an upper surface of the first substrate SUB10 is exposed by etching from the protection layer P10 to the intermediate layer N10. Alternatively, the etching operation may also be performed only from the protection layer P10 to the catalyst layer CT10. In this case, the intermediate layer N10 may not be etched but be maintained as a continuous layer. A predetermined or desired trench T10 may be formed between the device portions DP10 by the patterning operation. The plurality of device portions DP10 that are separated by the patterning operation may be regularly arranged in a plurality of rows and columns when seen from above. In addition, when seen from above, the trench T10 formed between the plurality of device portions DP10 may have a structure similar to a mesh structure. In this respect, the patterning operation described above may be referred to as mesh patterning.

Figure 8C:
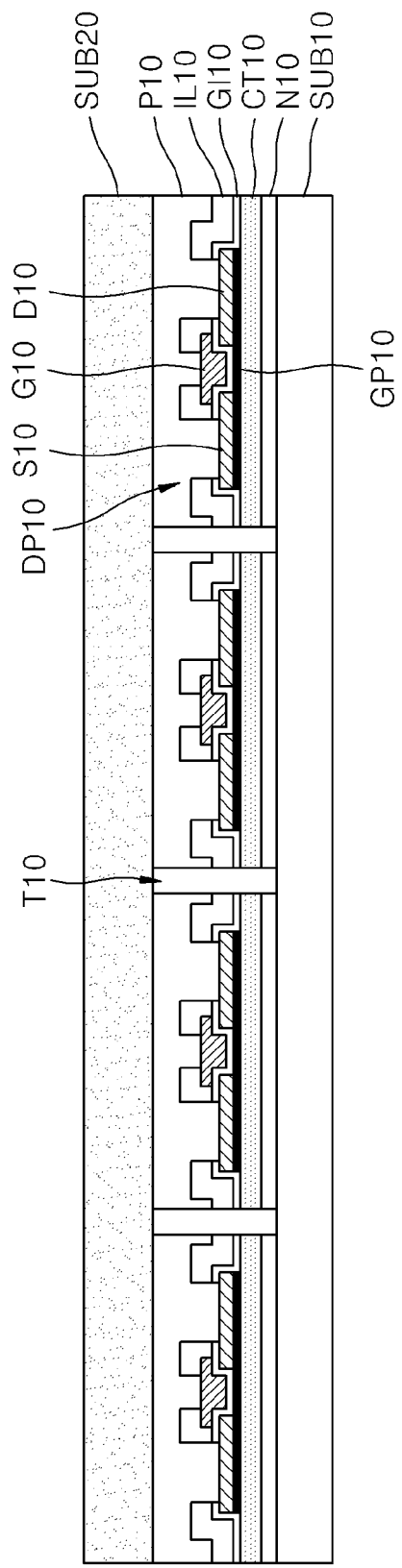

Referring to FIG. 8C, a second substrate SUB20 may be attached on the plurality of device portions DP10. Since the trench T10 is formed between the plurality of device portions DP10, when the second substrate SUB20 is attached, bubbles (air) may leak out through the trench T10. Accordingly, the second substrate SUB2 may be easily attached. The second substrate SUB20 may support the plurality of device portions DP10. The second substrate SUB20 may be formed of a substrate that is formed using substantially the same material as the second substrate SUB2 of FIG. 1G.

Figure 8D:
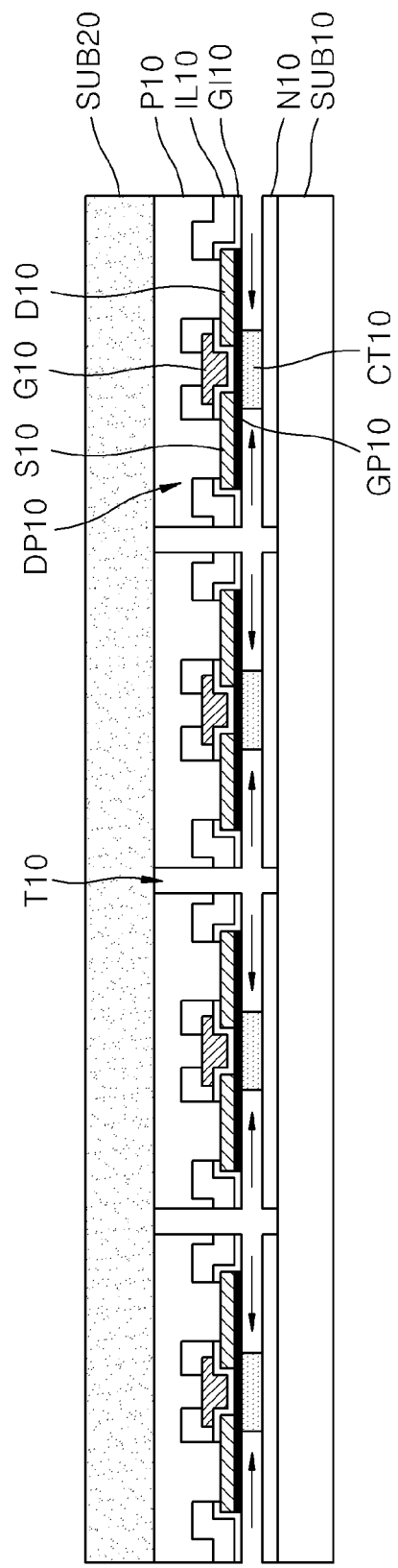

Referring to FIG. 8D, a predetermined, desired, or given etching solution (not shown) may be injected into the trench T10 between the plurality of device portions DP10 in order to etch the catalyst layer CT10 or the intermediate layer N10. According to a non-limiting embodiment, an etching process with respect to the catalyst layer CT10 is illustrated. Since an etching solution may be injected with relative ease between the plurality of device portions DP10, the catalyst layer CT10 may be relatively easily etched. Even when the first substrate SUB10 is a large-size substrate, the catalyst layer CT10 may be relatively easily removed in a short period. This means that the first substrate SUB10 may be relatively easily removed/separated. As the catalyst layer CT10 is etched in order to remove the first substrate SUB10, the catalyst layer CT10 may be referred to as a type of sacrificial layer. When removing the first substrate SUB10 by etching the intermediate layer N10 instead of the catalyst layer CT10, the intermediate layer N10 may be referred to as a sacrificial layer. The catalyst layer CT10 may be a metal layer, and the intermediate layer N10 may be an insulating layer, and the sacrificial layer may be a metal layer or an insulating layer.

Figure 8E:
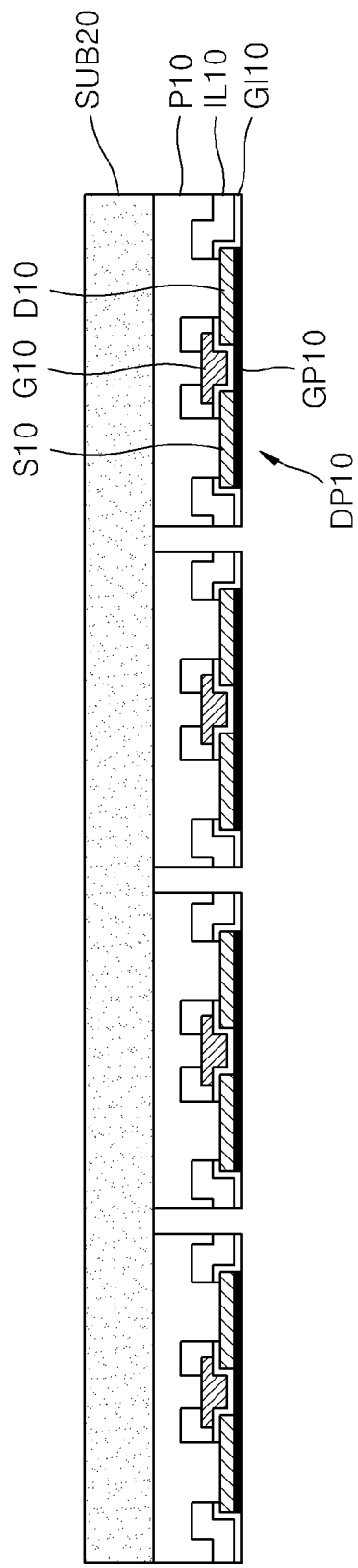

A resultant structure after the first substrate SUB10 is removed/separated in FIG. 8D is illustrated in FIG. 8E. The device portions DP10 may have the same structure as the device portion DP1 of FIG. 1H. Then, although not shown in the drawings, predetermined or desired subsequent operations may be performed with respect to the structure of FIG. 8E. The subsequent operations may be similar to those illustrated in FIGS. 1I through 1L. The method illustrated in FIGS. 8A through 8E may be similarly applied not only to the operations illustrated in FIGS. 1A through 1L but also to the operations illustrated in FIGS. 3A through 3D and the operations illustrated in FIGS. 6A through 6D.

When the method illustrated in FIGS. 8A through 8E is used, the method of manufacturing a graphene device, according to example embodiments, may also be applied to a large-size substrate having a diameter of 300 mm or greater. Thus, according to one or more of the above non-limiting embodiments, productivity of the graphene device may be improved and the manufacturing costs thereof may be reduced.

While the disclosure has been particularly shown and described with reference to various example embodiments, the example embodiments should be considered in descriptive sense only and not for purposes of limitation. For example, it will be understood by those skilled in the art that various changes in form and details may be made to the method of manufacturing a graphene device, according to example embodiments, and the graphene device manufactured by the described methods. Also, the above described example embodiments may also be applied to other graphene devices besides graphene transistors. Therefore, the scope of the disclosure is not to be limited by the examples in the detailed description and is defined by the appended claims.

What is claimed is:

1. A method of manufacturing a graphene device, the method comprising:
    forming a graphene layer on a first substrate;
    forming a device portion on the first substrate, the device portion including the graphene layer and a semiconductor device;
    attaching a second substrate onto the device portion; and
    removing an entirety of the first substrate to expose substantially an entirety of a side of the graphene layer facing the first substrate.

2. The method of claim 1, wherein the forming a device portion comprises forming a source electrode and a drain electrode respectively contacting a first region and a second region of the graphene layer.

3. The method of claim 2, wherein the forming a device portion comprises:
    forming a gate insulating layer covering the graphene layer, the source electrode, and the drain electrode; and
    forming a gate on the gate insulating layer and between the source electrode and the drain electrode.

4. The method of claim 3, further comprising:
    forming an insulating layer covering the device portion and between the device portion and the second substrate; and
    etching portions of the insulating layer and the gate insulating layer to expose the source electrode, the drain electrode, and the gate.

5. The method of claim 3, further comprising:
    attaching a third substrate on the device portion after the removing the first substrate, wherein the device portion is disposed between the second substrate and the third substrate.

6. The method of claim 5, further comprising:
    removing the second substrate.

7. The method of claim 5, wherein the attaching a third substrate includes selecting one of a glass substrate, a plastic substrate, and a polymer substrate as the third substrate.

8. The method of claim 5, wherein the attaching a third substrate includes selecting a flexible substrate as the third substrate.

9. The method of claim 5, further comprising:
    forming a protection layer between the device portion and the third substrate.

10. The method of claim 3, further comprising:
    forming an insulating layer covering the device portion after the removing the first substrate, wherein the device portion is disposed between the insulating layer and the second substrate.

11. The method of claim 10, further comprising:
    forming a first pad portion, a second pad portion, and a third pad portion, respectively, from the source electrode, the drain electrode, and the gate, the insulating layer covering the first through third pad portions; and
    etching portions of the insulating layer to expose the first through third pad portions.

12. The method of claim 2, further comprising:
    forming a gate insulating layer covering the graphene layer, the source electrode, and the drain electrode after the removing the first substrate; and
    forming a gate on the gate insulating layer and between the source electrode and the drain electrode.

13. The method of claim 12, further comprising:
    forming a first pad portion and a second pad portion, respectively, from the source electrode and the drain electrode; and
    etching portions of the gate insulating layer to expose the first and second pad portions.

14. The method of claim 1, further comprising:
forming a catalyst layer between the first substrate and the graphene layer.

15. The method of claim 14, further comprising:
forming an intermediate layer between the first substrate and the catalyst layer.

16. The method of claim 14, wherein the removing the first substrate comprises etching the catalyst layer.

17. The method of claim 15, wherein the removing the first substrate comprises etching one of the catalyst layer and the intermediate layer.

18. The method of claim 1, further comprising:
forming a protection layer covering the device portion on the first substrate before the attaching a second substrate.

19. The method of claim 1, wherein the attaching a second substrate includes selecting a polymer substrate as the second substrate.

20. The method of claim 1, further comprising:
forming a device layer including a plurality of the device portion on the first substrate; and
separating the plurality of the device portion by patterning the device layer.

21. The method of claim 20, further comprising:
forming a sacrificial layer between the first substrate and the device layer.

22. The method of claim 21, wherein the removing the first substrate comprises etching the sacrificial layer by injecting an etching solution between the plurality of the device portion.

23. The method of claim 21, wherein the forming a sacrificial layer includes selecting a metal layer or an insulating layer as the sacrificial layer.

24. The method of claim 3, wherein the forming a gate includes forming the gate so as to overlap the source electrode and the drain electrode in a vertical direction relative to the graphene layer.

25. A method of manufacturing a graphene device, the method comprising:
forming a graphene layer on a first substrate;
forming a device portion on the first substrate, the device portion including the graphene layer and a semiconductor device;
attaching a second substrate onto the device portion, the second substrate being a temporary substrate;
removing an entirety of the first substrate to expose substantially an entirety of a side of the graphene layer facing the first substrate;
attaching a third substrate on the device portion after the removing the first substrate, the device portion being disposed between the second substrate and the third substrate; and
removing an entirety of the second substrate from the device portion.

26. The method of claim 25, wherein the attaching a second substrate onto the device portion includes forming a bonding interface between the device portion and the second substrate, and
wherein the removing an entirety of the second substrate includes exposing the bonding interface.

* * * * *